United States Patent
Michel et al.

(10) Patent No.: US 6,700,074 B2
(45) Date of Patent: Mar. 2, 2004

(54) ELECTRICAL COMPONENT HOUSING STRUCTURES AND THEIR METHOD OF MANUFACTURE

(75) Inventors: Kurt Michel, Pegnitz (DE); Stefan Ehmann, Nuremberg (DE); Roland Friedl, Auerbach (DE); Günter Bauer, Sulzbach-Rosenberg (DE)

(73) Assignee: Cherry GmbH, Auerbach/Opf (DE)

( * ) Notice: Subject to any disclaimer, the term of this patent is extended or adjusted under 35 U.S.C. 154(b) by 0 days.

(21) Appl. No.: 10/012,796

(22) Filed: Oct. 19, 2001

(65) Prior Publication Data

US 2002/0048974 A1 Apr. 25, 2002

(30) Foreign Application Priority Data

Oct. 19, 2000 (DE) .......................................... 100 51 884

(51) Int. Cl.[7] .................................................. H05K 1/16
(52) U.S. Cl. ........................ 174/260; 174/254; 361/760
(58) Field of Search ................................. 174/260, 254, 174/52.2, 52.4, 117 FF, 250; 361/760, 749, 785, 801, 802, 809

(56) References Cited

U.S. PATENT DOCUMENTS

| | | | | |
|---|---|---|---|---|
| 4,958,260 A | * | 9/1990 | Kobayashi et al. | ......... 361/749 |
| 5,170,328 A | * | 12/1992 | Kruppa | ....................... 361/749 |
| 5,179,501 A | * | 1/1993 | Ocken et al. | ................ 361/709 |
| 5,229,916 A | * | 7/1993 | Frankeny et al. | ........... 361/718 |
| 5,265,322 A | * | 11/1993 | Fisher et al. | .................. 29/848 |
| 5,434,362 A | * | 7/1995 | Klosowiak et al. | ......... 174/254 |
| 5,452,182 A | * | 9/1995 | Eichelberger et al. | ...... 361/749 |
| 5,555,159 A | * | 9/1996 | Dore | .......................... 361/796 |
| 5,886,875 A | * | 3/1999 | Phelps et al. | ................ 361/752 |
| 5,998,738 A | * | 12/1999 | Li et al. | ...................... 174/250 |
| 6,195,261 B1 | * | 2/2001 | Babutzka et al. | ........... 361/752 |
| 6,340,791 B1 | | 1/2002 | Stotz | |
| 6,436,517 B1 | * | 8/2002 | Zahn | .......................... 428/209 |

FOREIGN PATENT DOCUMENTS

| | | |
|---|---|---|
| DE | 35 36 486 C1 | 5/1987 |
| DE | 94 03 207.6 | 6/1994 |
| DE | 44 08 176 A1 | 9/1995 |
| DE | 44 36 523 A1 | 4/1996 |
| DE | 198 04 170 A1 | 8/1999 |

* cited by examiner

*Primary Examiner*—Kamand Cuneo
*Assistant Examiner*—I B Patel
(74) *Attorney, Agent, or Firm*—Fulbright & Jaworski

(57) ABSTRACT

The invention provides a carrier housing assembly holding a flexible foil having conductive tracks in which the housing assembly has a plurality of parts each having a respective securing mechanism, the securing mechanisms being mutually engageable to provide a predetermined spatial relationship between the part, thereby providing the flexible foil with a predetermined spatial arrangement. The housing assembly is particularly relevant to component housing assemblies where electrical components are held in place and connected to connecter pins via the flexible foil. In a further aspect of the invention, there is provided methods for manufacturing a foil carrier housing assembly out of a flexible foil comprising conductive tracks at least one electrical component, at least one electrical contact element, at least one component housing and a carrier housing.

9 Claims, 8 Drawing Sheets

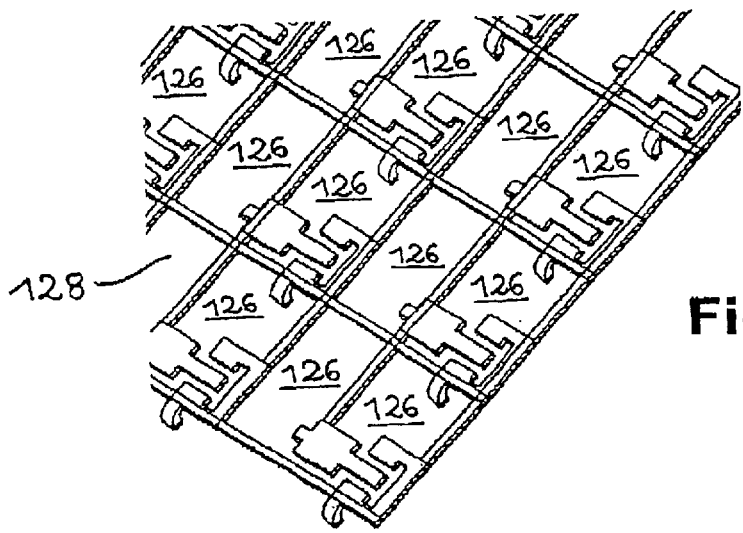
Fig. 11
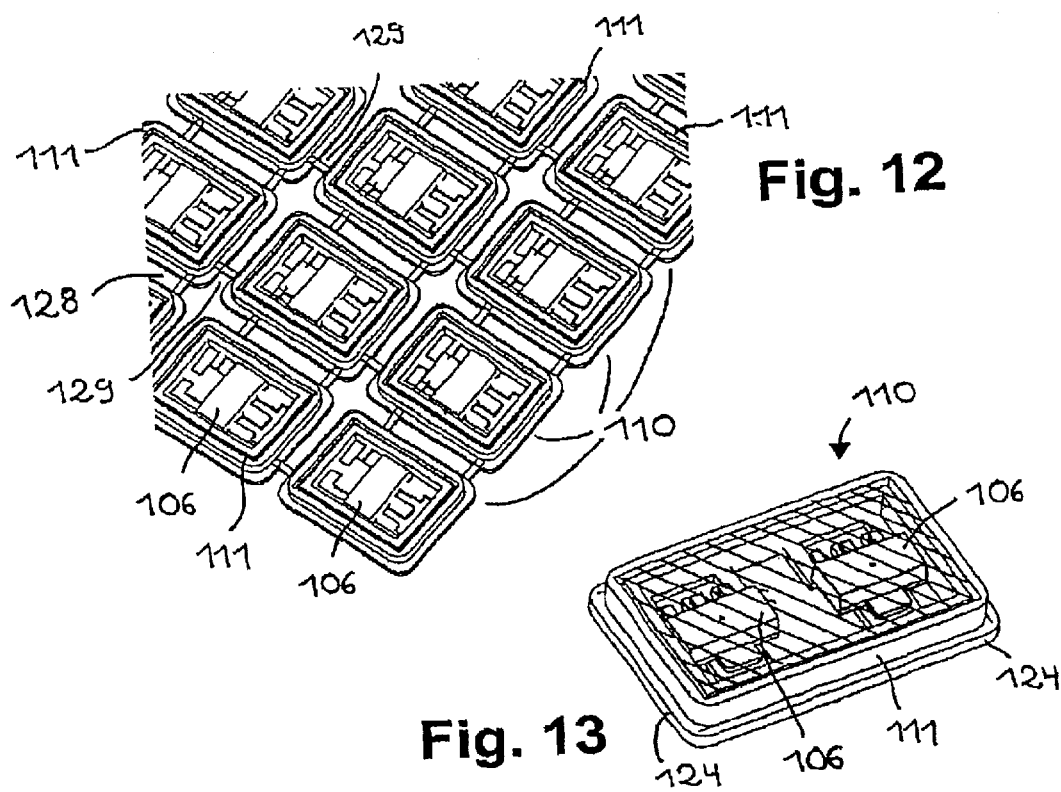
Fig. 12
Fig. 13

ELECTRICAL COMPONENT HOUSING STRUCTURES AND THEIR METHOD OF MANUFACTURE

FIELD OF THE INVENTION

The present invention relates to electrical component housing structures and methods for their manufacture.

BACKGROUND OF THE INVENTION

Flexible foil carrier housing assemblies are well-known. These assemblies comprise a foil and a carrier housing. Electrical components, which can be resistors, capacitors, coils, transistors or the like, as well as electrical contact elements which can be mechanical, electrical or magnetic switches, contact pins or the like, are arranged on the foil and are electrically connected to conductive tracks of the foil.

It is known from prior art to provide carrier structures which shape flexible conductor foils in space and which keep said foils in that shape. For example, an interaction between carrier structures and foils of this type is described in the German laid-open document DE 44 36 523 A1 and DE 199 40 339 A1. The carrier structures according to those documents are manufactured by injection molding around the foils with a molding mass forming said carrier structure. The shape determined for the carrier structure during the injection molding determines the shape of the foil in space. Changing the shape of the foil after the carrier structure is injection molded is disadvantageously not possible.

Methods of manufacturing a foil carrier housing assembly are known from prior art.

For example, the German laid-open document DE 44 36 523 A1 shows a method for manufacturing a foil carrier housing assembly wherein at first in a first method step, a foil provided with electrical components and contact elements is partially injection molded with a molding mass, such that recesses corresponding to the component housings remain in the region of the components and the contact elements, wherein subsequently in a second method step, the foil is provided with components and/or contact elements through the recesses, and wherein finally in a third method step, the partially injection molded foil is once again injection molded with said injection molding mass whereby a carrier housing is manufactured.

The German laid-open document DE 199 40 339 A1, in turn, discloses a method for manufacturing a foil carrier housing assembly wherein the foil is injection molded with an injection molding mass within a molding tool, such that a carrier housing in the form of a lattice-like or net-like plastic casing is produced.

The methods of the above mentioned documents have in common that it is not possible to replace the foil or the electrical element in foil carrier housing assemblies manufactured according to them, which is for example necessary in the case of a defect of the foil or the component.

BRIEF SUMMARY OF THE INVENTION

The present invention provides a carrier structure comprising at least two portions, each portion being provided with at least one securing mechanism, such that the securing mechanisms can engage each other for generating a fixed spatial arrangement of said portions with respect to each other. In contrast to prior art, the carrier structure according to the invention is not fixed in its form after its manufacture, but can modify its shape by modifying the spatial arrangement of the portions with respect to each other. The respective arrangement of the portions with respect to each other is fixed by means of a securing mechanism. Since the carrier structure holds the foil and since thus each portion of the carrier structure likewise holds a part of the foil, the modification of the spatial arrangement of the portions with respect to each other involves a shaping of the flexible foil in space. Thereby, the shape of the foil in space can be modified also after the manufacture of the carrier housing.

There are different exemplary embodiments of the carrier structure. One exemplary embodiment of the carrier structure which is realized as a carrier lattice comprising enclosing frames and transversal bridges, is especially advantageous. The lattice-like or net-like structure advantageously material-saving. Furthermore, said structure provides also after the manufacture of the carrier structure portions of the foil between the enclosing frames and the transversal bridges which are accessible from outside. Thereby, also after the manufacture of the carrier structure, for example electrical components or the like can be placed on the surface of the foil.

Likewise, there are different exemplary embodiments for the securing mechanisms. For example one of mechanisms can be realized as plug-in pin and the other as plug-in socket. In this case, generating a fixed spatial arrangement between the portions of the carrier structure with respect to each other corresponds to introducing the plug-in pins into the plug-in sockets. The plug-in pins are frictionally engaged within the plug-in sockets. Therefore, the engagement between plug-in pin and the plug-in socket is removable by pulling the plug-in pin out of the plug-in socket. In case a permanent fixing of the plug-in pin within the plug-in socket has to be secured, the plug-in pin can for example be glued in the plug-in socket.

The carrier structure can hold the foil in several ways. One exemplary embodiment of the carrier structure comprises holding pins and holding openings for that purpose. The holding pins of the carrier structure and the holding openings of the foil are assigned to each other in number and arrangement. In this exemplary embodiment, the carrier structure holds the foil in that the holding pins penetrate the holding openings. In order to guarantee a fixed holding of foil by the carrier structure, the heads of the holding pins can be deformed. Moreover, the holding of the foil by the carrier structure can be realized in that the foil is glued onto the carrier structure. Likewise it is possible to manufacture the carrier structure by injection molding or casting around the foil with a molding mass. In this case, the holding of the foil by the carrier structure is effected such that the molding mass adheres to the foil. Preferably, the molding mass is plastic. As far as manufacturing methods are concerned, it is advantageous if the securing mechanisms are manufactured with the manufacture of the carrier structure since in this case, the carrier structure and the securing mechanism are manufactured in one step. After the manufacture of the carrier structure by injection molding or casting, the portions of the carrier structure are moveable with respect to each other and, so to say, kept together only by the foil. In case the portions are moved with respect to each other unintendedly, a damage to the foil in the region between the two portions of the carrier structure can result. In order to avoid this, one exemplary embodiment of the invention provides breakable bridges which connect the portions of the carrier structure. The breakable bridges prevent an unintended movement of the portions with respect to each other. They may be removed before the foil is shaped in space.

The foil can be provided with a plurality of electrical components and/or electrical contact elements. For example the electrical components are resistors, capacitors, coils, transistors or the like, and the electrical contact elements can be mechanical, electrical or magnetic switches, contact pins and the like.

Handling the manufacture of the carrier structure is especially easy if the carrier structure is plane before the foil is shaped in space. This means, that the enclosing frames, the transversal bridges and, if present, the breakable bridges of the carrier structure as well as the foil extend in a plane.

One aspect of the invention provides a method for manufacturing a component carrier structure comprising the steps of: manufacturing the carrier structure and securing mechanisms by injection molding or casting around a foil, and generating an engagement between the securing mechanisms. Thus, by adding to step of manufacturing the carrier structure by injection molding or casting around the foil one additional method step of manufacturing an engagement between the securing mechanisms, modifying the spatial arrangement of the portions of the carrier structure with respect to each other for shaping the foil in space is possible also after a carrier structure is manufactured.

In case that the two portions of the carrier structure are connected by breakable bridges, the latter may be removed before the foil is shaped in space.

In one exemplary embodiment of the method, a further step is performed which comprises the manufacture of a carrier housing by injection molding or casting the carrier structure with a molding mass. In this case, the carrier structure represents an intermediary tool maintaining the shape of a foil in space for manufacturing the carrier housing. After the carrier housing is manufactured, the carrier structure is a part of the carrier housing; in particular if the carrier structure and the carrier housing are manufactured using the same molding mass, the carrier housing and the carrier structure cannot be distinguished from each other.

It is possible, to provide the foil with electrical components and/or electrical contact elements at various points in the manufacture process.

According to a second aspect of the invention, there is provided a method for manufacturing an electrical component housing assembly including a flexible foil incorporating a plurality of conductive tracks, said conductive tracks being selectively electrically connected to respective contact elements and at least one electrical component located within a component housing, said method comprising the steps of: [1a] mechanically and electrically connecting the foil to the electrical component and the electrical contact element, [1b] manufacturing at least one open component housing around at least one of the electrical components by injection molding or casting, [1c] sealing the open component housings by injection molding or casting, and [1d] mechanically connecting the sealed component housings to the carrier housing. In contrast to the prior art methods, mechanically connecting at least one part of the foil and the carrier housing is provided as a last step in the method according to the invention. Preferably, the connection between the foil and the carrier housing enables a quick replacement of the foil and/or the electrical component.

In step [1a], the electrical components and the contact elements can be connected to the foil in several ways. The more important of these ways are soldering or welding, particularly laser welding.

In step [1c], sealing the component housings can be performed, such that the components contained in the component housings are totally covered by injection molding mass. In this case, the component is completely encapsulated and therefore optimally protected from harmful external influences. Additionally, sealing the component housings in step [1c] can be performed, such that the components contained in the component housings are nearly partially covered by the injection molding mass which is for example advantageous when the component comprises connection portions to which further electrical components are connected to later or if the component is to be trimmed later. In this case, the component housings can also be completely sealed during a further step performed after step [1d].

Furthermore, there is provided a second method for manufacturing an electrical component housing assembly including a flexible foil incorporating a plurality of conductive tracks, said conductive tracks being selectively electrically connected to respective contact elements and at least one electrical component located within a component housing, said method comprising the steps of: [2a] manufacturing a component housing, [2b] manufacturing the component housing by injection molding or casting contact element, and [2c] mechanically and electrically connecting the foil, the component housing and the carrier housing. This method according to the invention is likewise distinguished from prior art by mechanically connecting a foil and the carrier housing as a last step. According to the above explanations, the second method enables a quick replacement of the foil and/or the electrical components, as well.

There is also provided a still further method of manufacturing an electrical component housing assembly including a flexible foil incorporating a plurality of conductive tracks, said conductive tracks being selectively electrically connected to respective contact elements and at least one electrical component located within a component housing, said method comprising the steps of: [3a] manufacturing component housings, [3b] manufacturing the carrier housing by reverse side injection molding or casting the foil and [3c] mechanically and electrically connecting the carrier housing, the contact elements and the component housings. In accordance with the two methods already explained, this method likewise provides mechanically connecting as a last step whereby also in this case, a quick replacement of the foil and/or the electrical component is enabled.

As far as manufacturing the component housings in step [2a] or [3a] is concerned, a method is especially preferred which comprises the following steps: [A] manufacturing a punched lattice comprising a plurality of structurally identical portions by punching a sheet consisting of electrically conductive material, or providing a circuit board having a plurality of structurally identical portions, [B] manufacturing open component housings by injection molding or casting each of the structurally identical portions, [C] mechanically and electrically connecting the open component housings to the electrical components by soldering or welding, preferably laser welding, the components within the component housings, such that the electrical component are conductively connected to the punched lattice or the circuit board, [D] sealing the component housings by injection molding or casting the component housings, and [E] separating the component housings by cutting the punched lattice or the circuit board. By using this method, a great number of component housings can quickly and easily be manufactured.

Step [2c] or [3c] proving mechanically and electrically connecting can be realized in different ways. For example, the foil can have in the region of the conductive tracks openings, and the component housings can have pin like punched lattice connecting portions assigned in number and arrangement to said openings. In this case, mechanically and electrically connecting in step [2c] or [3c] means introducing the punched lattice connecting portions into the openings, generating a contact between the punched lattice connecting portions and the conductive tracks and, if necessary, soldering or welding (laser welding) the punched lattice connecting portions to the conductive tracks.

Mechanically connecting according to step [1d], [2c] or [3c] can be realized in different ways. For example, the carrier housing can have a recess the cross section of which corresponds to the shape of foil. In this case, mechanically connecting according to step [1d], [2c] or [3c] corresponds to introducing the foil into the recess. Alternatively or additionally, the carrier housing can have connecting protrusions, and the foil can have connecting openings assigned in number and arrangement to the connecting protrusions. In this case, mechanically connecting according to step [1d], [2c] or [3c] means introducing the connecting protrusions into the connecting openings respectively assigned and subsequent pressure deforming the connecting protrusions. Alternatively or additionally, the carrier housing can have connecting pockets having receiving grooves, and the component housings can have engaging edges assigned in number and arrangement to the receiving grooves. In this case, mechanically connecting according to step [1d], [2c] or [3c] means introducing the engaging edges into the receiving grooves until the component housings are completely received within the connecting pockets.

A preferred embodiment of the method provides that the conductive tracks of the foil are copper tracks.

Preferably, the component housings and a carrier housing are made of plastic.

INTRODUCTION TO THE DRAWINGS

The invention will now be described by way of example with reference to the following drawings in which:

FIG. 11 shows a punched lattice before a plurality of component housings according to step [2a] of said second method is performed.

FIG. 12 shows said plurality of said component housings according to step [2a] of said second method.

FIG. 13 shows a component housing according to step [2a] of said second method.

DETAILED DESCRIPTION OF THE PREFERRED EMBODIMENTS

Figure 1:
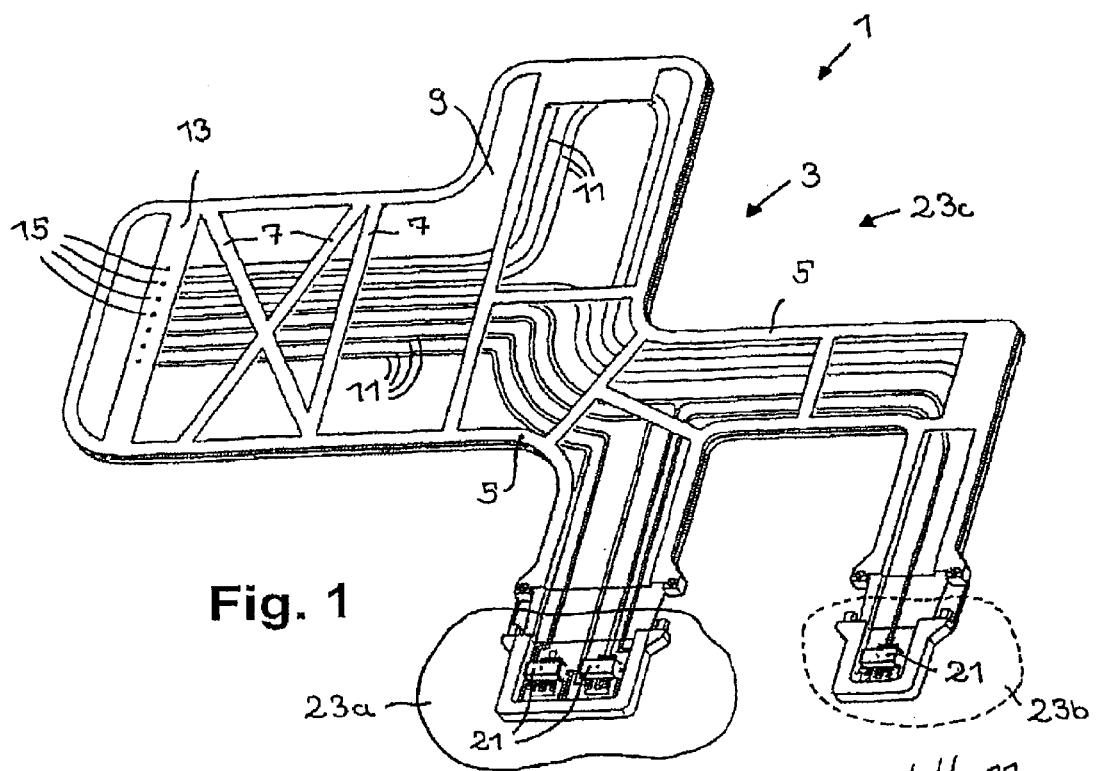
FIG. 1 shows an exemplary embodiment of a carrier structure according to the invention before a foil is shaped in space.

FIGS. 1–5 show a first aspect of the invention describing a component housing assembly. FIG. 1 shows a carrier structure 1 in the form of is a plane carrier lattice 3. Carrier lattice 3 comprises an enclosing frame 5 and a plurality of transverse bridges 7. Enclosing frame 5 encloses the carrier lattice 3 whereas the transverse bridges 7 connect different portions of the enclosing frame 5 or different portions of enclosing frame 5 and other transversal bridges 7.

A flexible foil 9 is imbedded within carrier lattice 3. Foil 9 has a shape corresponding to that of carrier lattice 3; therefore the enclosure of foil 9 is adjacent to the enclosing frame 5 of carrier lattice 3. Foil 9 lies flat on enclosing frame 5 and transversal bridges 7 of carrier lattice 3 and adheres to them. Therefore, foil 9 just like carrier lattice 3 is planar and extends in the same extension plane as the latter. Since foil 9 adheres to carrier lattice 3, carrier lattice 3, holds foil 9. As a consequence, carrier lattice 3 determines the spatial shape of foil 9. As far as the state depicted in FIG. 1 is concerned, this means that plane carrier lattice 3 or plane carrier structure 1 involve the plane shape of flexible foil 9.

Foil 9, however, can be held by carrier structure 1 in a different way too. For example, foil 9 can be glued onto carrier structure 1. Moreover, carrier structure 1 can be provided with holding pins which penetrate holding openings arranged in foil 9 and the heads of which are deformed to hold the foil 9 in place.

Foil 9 comprises a plurality of conductive tracks 11. Conductive tracks 11 are arranged at the surface of foil 9 and form a layout thereon. Different arrangements of conductive tracks 11 are likewise possible, for example a multilayer foil where the conductive tracks are arranged inside the foil.

Conductive tracks 11 end adjacent to a lateral enclosing bridge 13 of carrier lattice 3. Here, lateral enclosing bridge 13 comprises a plurality of contact through-holes 15. Each conductive track 11 of foil 9 is assigned to one contact through hole 15. As it can be seen in FIG. 3, an electrical contact element 19 being realized as contact pin 17 is frictionally engaged in each of contact through holes 15. Contact elements 19 are conductively connected to conductive tracks 11 respectively assigned thereto. By means of electrical contact elements 19, the conductive tracks of the foil may be connected to a power or current source (not shown), or other parts of an electrical circuit.

Moreover, a plurality of electrical components 21 is arranged on foil 9. In the depicted exemplary embodiment, electrical components 21 are realized as resistors which are conductively connected to conductive tracks 11 of foil 9. As a consequence, there is a continuous conductive connection between contact pin 17 (FIG. 3), conductive tracks 11 and components 21.

Carrier structure 1 comprises three portions namely a portion 23a which is marked by a continuous closed line in FIG. 1, a portion 23b which is marked by a dashed closed line in FIG. 1, and a portion 23c which with respect to carrier structure 1 of FIG. 1 represents the complement with respect to portions 23a and 23b, i.e., it corresponds to a portion 23c of carrier structure 1 in FIG. 1 which is neither marked by the continuous nor by the dashed line.

In portion 23a, foil 9 is provided with two electrical components 21, and in portion 23b with one electrical component 21. Portions 23a and 23b are in the form of an electrical component housing, providing a degree of protection for electrical components located therein.

Figure 2:
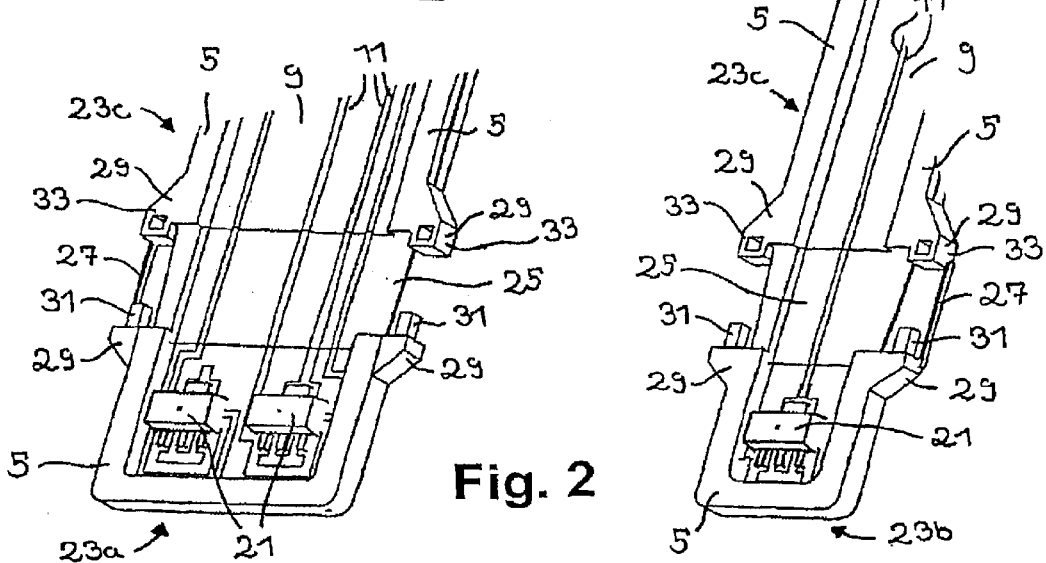
FIG. 2 shows a part of the carrier structure according to FIG. 1 in an enlarged scale.

FIG. 2 shows portions 23a and 23b in an enlarged scale wherein portion 23a of carrier structure 1 along with a part of portion 23 are shown in the left part of FIG. 2 whereas portion 23b of carrier structure 1 along with a part of portion 23c are shown in the right half of FIG. 2.

The left half of FIG. 2 clearly shows that portions 23a and 23c are connected to each other via a transition region 25 of foil 9 as well as by a breakable bridge 27. Breakable bridge 27 connects portion 23a to 23c of carrier structure 1 in the region of transition region 25 of foil 9, i.e., breakable bridge 27, so to say, replaces enclosing frame 5 in this region.

Adjacent to transition region 25, carrier structure 1 comprises four securing mechanisms 29. Two securing mechanisms 29 are assigned to portion 23a of carrier structure 1, and two securing mechanisms 29 are assigned to portion 23c of carrier structure 1. Each securing mechanism 29 assigned to portion 23a is a plug-in pin 31, and each securing mechanism 29 assigned to portion 23c is a plug-in socket 33. One plug-in pin 31 and one plug-in socket 33 are arranged opposite to each other in the region of enclosing frame 5 of carrier structure 1. Plug-in pins 31 and plug-in sockets 33 are formed, such that they can engage each other and such that plug-in pin 31 is frictionally engaged within plug-in socket 33.

It is clear that after removing breakable bridges 27, plug-in pins 33 of portion 23a of carrier structure 1 are introducible into plug-in socket 33 of portion 23c of carrier structure 1.

The above description of portion 23a is correspondingly applicable to portion 23b of carrier structure 1 which is shown in the right half of FIG. 2.

Figure 3:
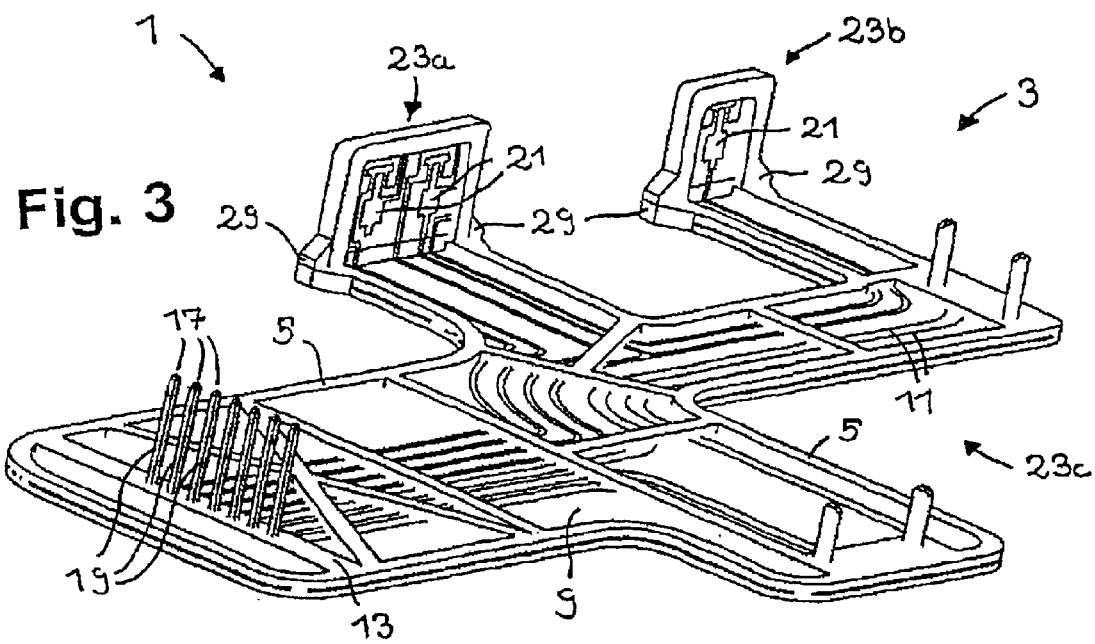
FIG. 3 shows the carrier structure according to FIG. 1 after the foil has been shaped in space, FIG. 4 a part of the carrier structure of FIG. 3 in an enlarged scale, FIG. 5 a carrier housing.
Figure 4:
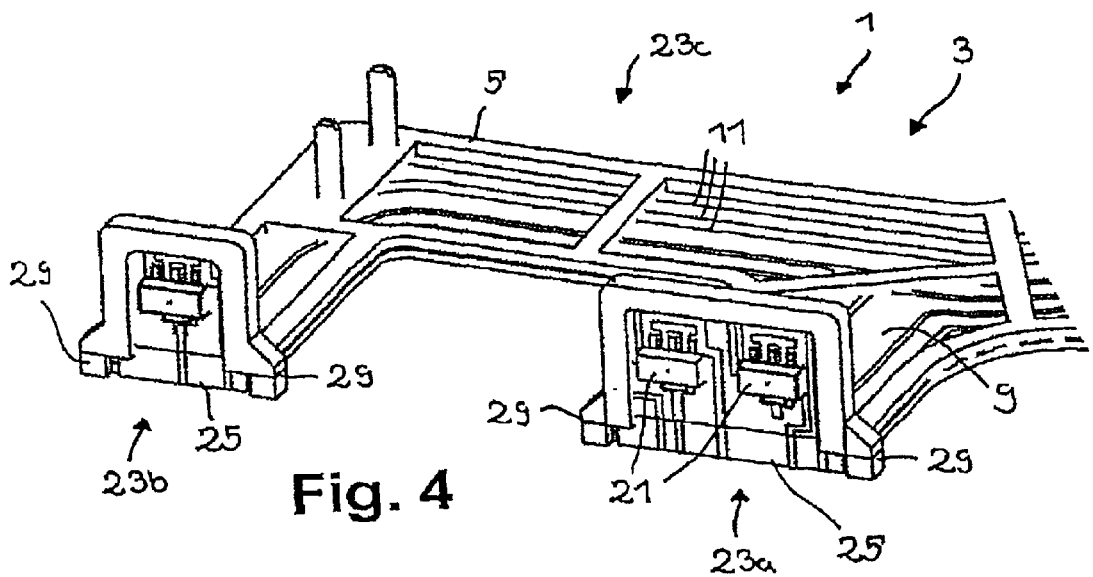

The state of carrier structure 1 in which plug-in pins 31 are introduced into plug-in sockets 33 of carrier structure 1 is shown in FIGS. 3 and 4.

A comparison between the state of carrier structure 1 according to FIGS. 1 and 2 and that according to FIGS. 3 and 4 clearly shows, that the former is characterized by portions 23a and 23c and thus those parts of the foil 9 which are held by portions 23a and 23c extend parallel and within the same plane whereas with respect to the latter, both portions 23a and 23c and thus the parts of foil 9 held by those portions 23a and 23c include an angle of approximately 90°. The same holds good for portions 23b and 23c of carrier structure 1.

Thus, the plane arrangement according to FIGS. 1 and 2 has turned into a spatial arrangement by the mutual engagement of securing mechanisms 29; securing mechanisms 29, therefore serve for shaping flexible foil 9 in space. Flexible foil 9 is held in a spatial shape by carrier structure 1 according to the invention. It is curved in transition regions 25 between portions 23a and 23c or portions 23b and 23c, respectively, which can in particular be seen in FIG. 4.

Figure 5:
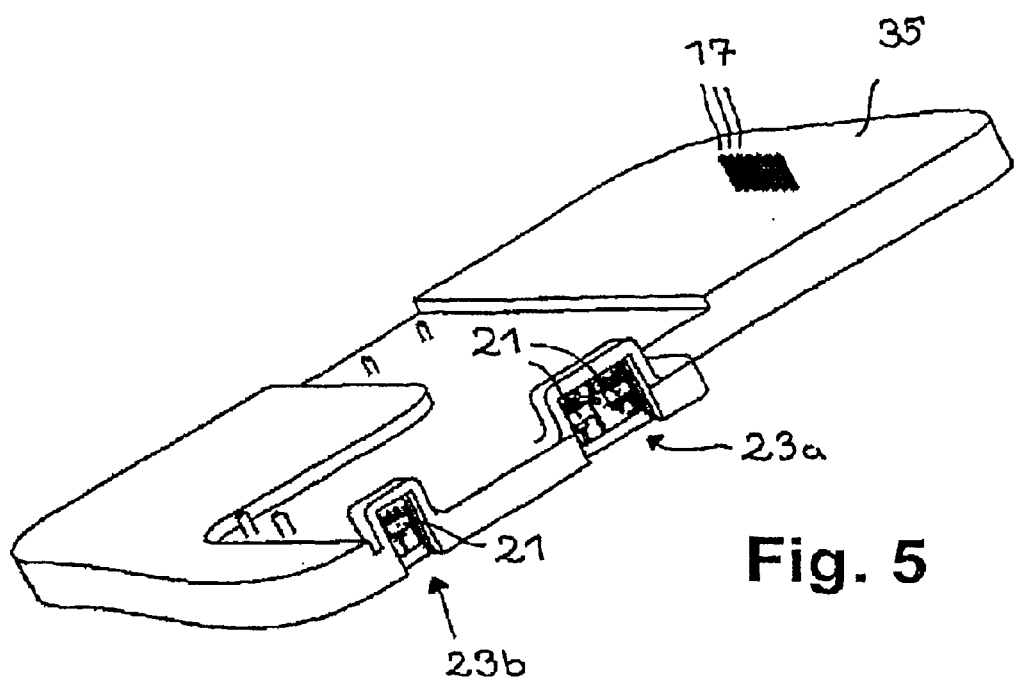

FIG. 5 shows a carrier housing 35. Carrier housing 35 is not lattice like or net like but is rather continuous in shape. Carrier housing 35 is manufactured by injection molding carrier structure 1 whereby carrier structure 1 has become a part of carrier housing 35. Carrier structure 1 and carrier housing 35 are manufactured out of the same plastic molding mass; therefore, carrier structure 1 and carrier housing 35 are hardly distinguishable from each other. Only contact pins 17 and electrical components 21 are visible at the manufactured carrier housing 35.

In the following, the method of manufacturing the carrier structure I will be described.

The state represented in FIGS. 1 and 2 corresponds to a state in which carrier structure 1 and securing mechanisms 29 are manufactured by injection molding foil 9. The state according to FIGS. 3 and 4 corresponds to a state after securing mechanisms 29 have engaged each other.

Between these states, breakable bridges 27 are removed. This removal may either be simply by bending or the bridges may actually be cut away.

The advantages of the method according to the invention by using a carrier structure according to the invention are particularly clear if one further method step follows in which carrier housing 35 is manufactured by injection molding or casting carrier structure 1 with a molding mass. Carrier structure 1—which is in this case also called "auxiliary molding structure" mainly serves for fixing foil 9 in a desired spatial shape before carrier housing 35 is manufactured by injection molding carrier structure 1.

Providing foil 9 with electrical components 21 or electrical contact elements 19 can be performed both before manufacturing carrier structure 1, as well as between the state according to FIGS. 1 and 2 as well as between the steps according to FIGS. 3 and 4.

Particular alternative arrangements to the structure 1 include only a single securing mechanism associated with each component housing.

A further aspect of the invention comprising an electrical component housing assembly is shown in FIGS. 6–17.

FIGS. 6 to 10 illustrate a first method of this further aspect of the invention.

Figure 6:
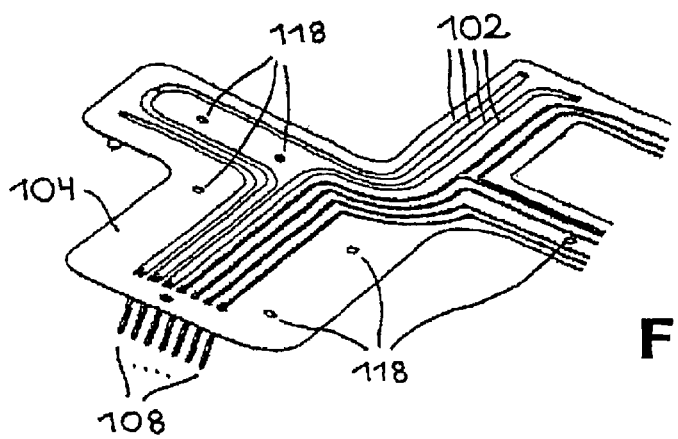
FIG. 6 shows a foil after step [1a] of a first method is performed.

FIG. 6 shows a flexible foil 104. Said flexible foil 104 is preferably of polyimide but it can, be of other materials conveying flexibility, for example polyester or the like. Said flexible foil 104 comprises a plurality of conductive tracks 102. Said conductive tracks 102 are arranged according to a preferred layout on the surface of said flexible foil 104. The tracks 102 are preferably of copper and manufactured according to known methods, for example etching a copper layer deposited on said flexible foil 104. Additionally, a plurality of electrical contact elements 108 are attached to said foil 104,. Each of said contact elements 108 is preferably soldered to a respective conductive track 102 and is thereby electrically connected thereto. Also, said flexible foil 104 incorporates a plurality of connecting openings 118, the purpose for which will be described later. Said connecting openings 118 are holes penetrating the flexible foil 104.

FIG. 6 shows said flexible foil 104 after a step of connecting said foil 104 and said contact elements 108 to each other, both mechanically and electrically.

Figure 7:
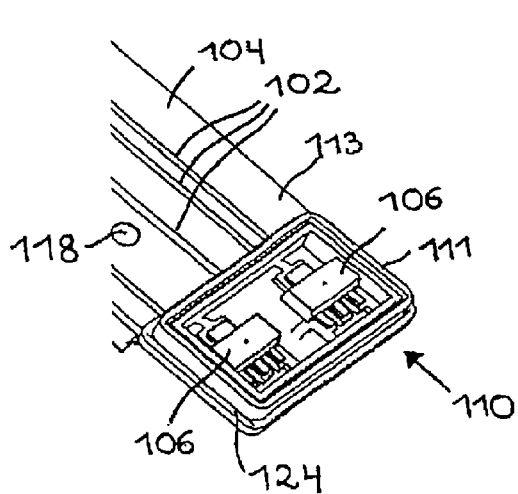
FIG. 7 shows a part of another foil after step [1b] of the first method is performed.
Figure 8:
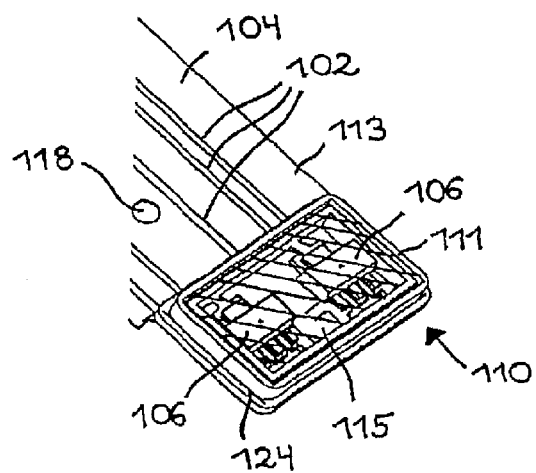
FIG. 8 shows a part of foil according to FIG. 2 after a step [1c] of said first method is performed.

In FIG. 7, another view of the foil 104 is shown in which two electrical components 106 have been soldered to said conductive tracks 102. As shown in FIG. 2, both components 106 are identical and arranged in parallel in a compact module. Said two components 106 are arranged within a component housing 110. Said component housing 110 comprises a surrounding wall 111 an upper edge of which is slightly higher than said two components 106. At a lower edge, facing towards the foil, an engaging edge 124 in the form of a surrounding protrusion is formed. Said component housing 110 is manufactured by means of injection molding. As shown in FIG. 7, said component housing 110 is arranged at a terminating end 113 of said foil 104. FIG. 8 shows the arrangement of FIG. 7 after sealing by the injection of molding mass 115.

Figure 9:
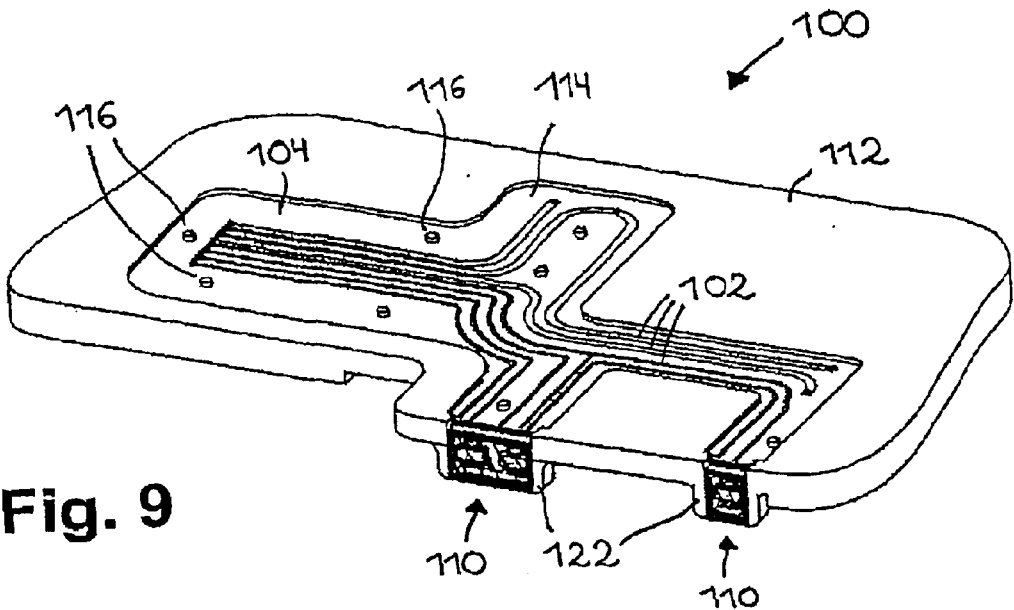
FIG. 9 shows a foil carrier housing assembly after a step [1d] of said first method is performed.

FIG. 9 shows the foil 104 arranged within a carrier housing 112. Said foil 104 is accommodated in a recess 114 of said carrier housing 112 and lies flat at the bottom of said recess 114. Thus, said carrier housing 112 and said foil 104 form a foil carrier housing assembly 100.

A connection between the foil 104 and the carrier housing 112 is provided by several means. The carrier housing 112 comprises a plurality of connecting protrusions 116 extending upwards from the bottom of said recess 114. Said connecting protrusions 116 correspond in number and arrangement to the connecting openings 118 of said foil 104 and penetrate those. The foil 104 is secured by pressure deforming the connecting protrusions, i.e. the ends thereof are thickened, such that such the connecting openings 118 of said foil 104 cannot slide over the connecting protrusions 116 of said carrier house 112.

As a second mechanical means for generating a connection between the foil 104 and the carrier housing 112, the carrier housing 112 comprises two connecting pockets 122. According to exemplary embodiment of FIG. 9, said connecting pockets 122 are arranged at the edge of said carrier housing 112 and extend in a plane extending perpendicular to the extension plane of said carrier housing 112 with a recess for receiving the component housing 110.

Figure 10:
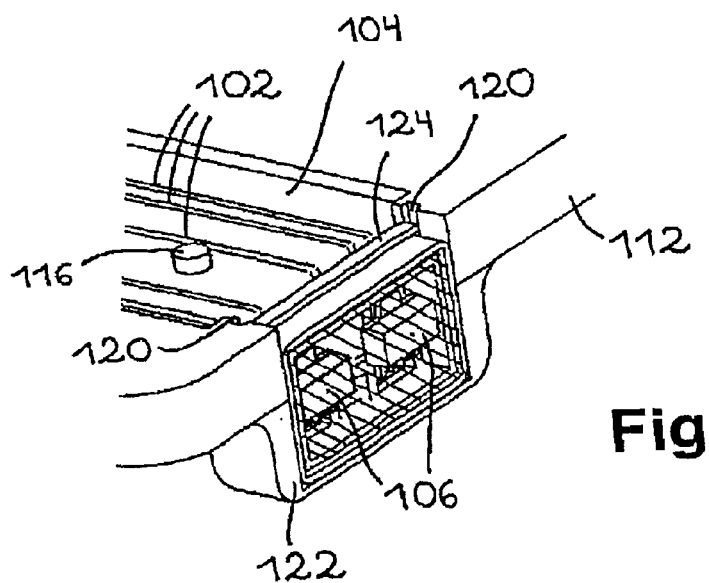
FIG. 10 shows a part of said foil carrier housing assembly according to FIG. 4 in a larger scale.

As shown in FIG. 10, said connecting pockets 122 are provided with a receiving grooves 120 at two opposite sites. The dimensions of said receiving grooves 120 are chosen, such that they can hold the engaging edges 124 of said component housing 110. Preferably, the edges 124 are frictionally restrained in said grooves 120.

The component housing assembly 100 according to FIGS. 9 and 10 is in a state in which the sealed component housing 110 and the carrier housing 112 are mechanically connected to each other.

A second method of the invention is shown by FIGS. 11–15 wherein FIGS. 11–12 show the manufacture of a plurality of component housings 110.

FIG. 11 shows a punched lattice array 128. Said punched lattice 128 forms a lattice array of an electrically conductive material and is manufactured by punching a metal sheet. The punched apertures comprises a plurality of structurally identical portions 126. Said structurally identical portions 126 are arranged in a regular lattice structure and thus form said punched lattice 128.

In FIG. 12, there is a surrounding wall 111 arranged each of said structurally identical portions 126 of said punched lattice 128. Said wall 111 is manufactured by injection molding around the structurally identical portions 126 and extends in a plane extending perpendicular to the extension plane of the punched lattice 128. Said wall is approximately rectangular in shape and forms a hollow therewithin. Within said hollow an electrical component 106 is arranged. Said electrical component 106 is soldered to the punched lattice 128 and conductively connected thereto. Each structurally identical portions 126 of said punched lattice 128 forms together with the electrical components 106 and the surrounding wall 111 a respective component housing 110.

The final manufactured component housing 110 is shown in FIG. 13. As showing in FIG. 13, each component housing 110 has been sealed by means of a molding mass indicated by a hatched area, and the respective component housings 110 separated from each other by cutting separating points 129 of said punched lattice 128.

Figure 14:
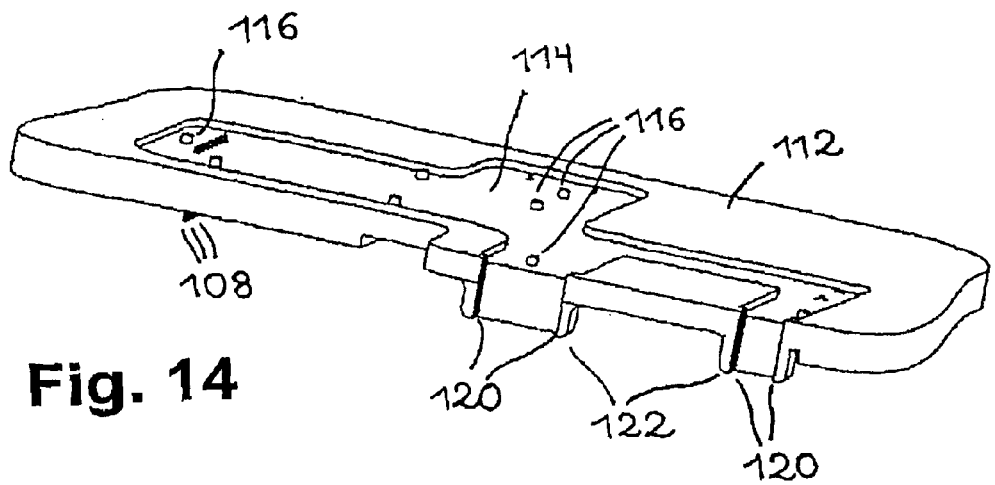
FIG. 14 shows a carrier housing after a step [2b] of a second method according to the invention is performed.

The carrier housing 112 according to the second method of the invention is shown in FIG. 14. The housing 112 is manufactured by injection molding around the electrical contact elements 108. During the injection molding, the recess 114, the connecting protrusions 116 extending outwardly way from the bottom of the recess 108, the connecting pockets 122 as well as the receiving grooves 120 provided therein are formed.

The steps of providing the carrier housing and the component housing can be performed simultaneously.

Figure 15:
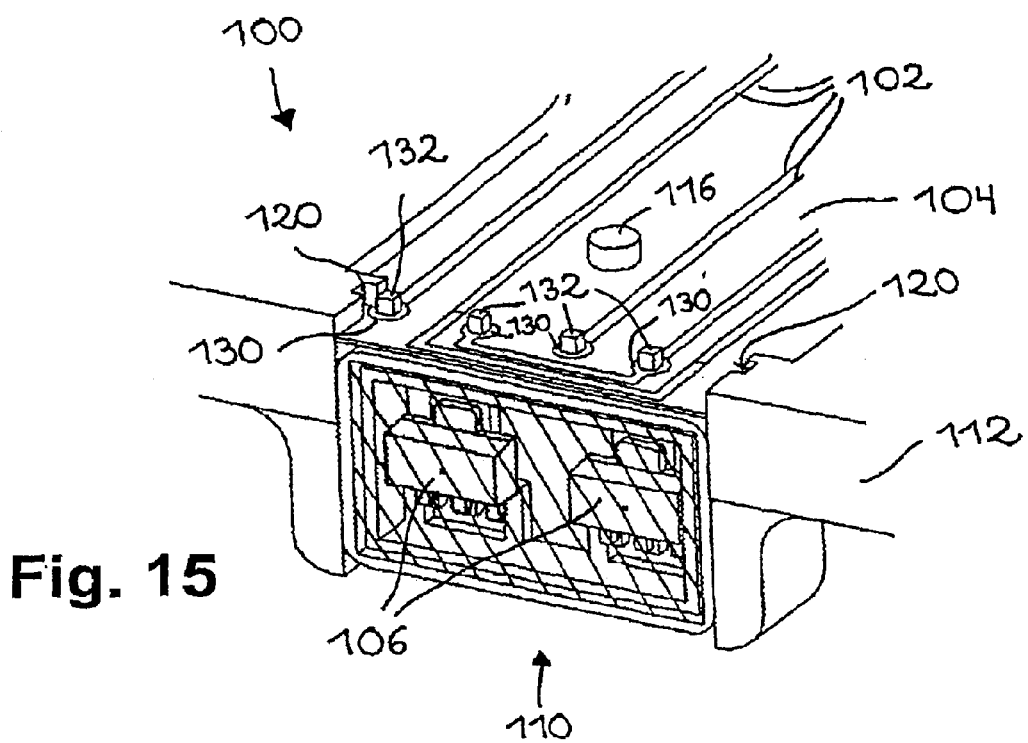
FIG. 15 shows a part of a foil carrier housing assembly after a step [2c] of said second method is performed.

FIG. 15 shows the state after the carrier housing 112, the component housing 110 and the flexible foil 104 have been connected together. FIG. 15 especially shows the type of electrical connection between the conductive tracks 102 and the component housing 110. For this purpose, openings 130 are arranged to some of the conductive tracks 110, the openings being through-holes penetrating the flexible foil 104. The interior of each opening 130 is plated with a conductive material. Said openings 140 are penetrated by punched lattice connecting portions 132 of said component housings 110. The punched lattice connecting portions 132 correspond to the separating points 129 of the punched lattice 128. The connecting portions are conductively connected to the electrical component 106 of the respective component housing 110. The connecting portions penetrate the openings 130 and are soldered, welded or conductively glued thereto. Therefore they are likewise connected to the conductive tracks 102 respectively assigned. As a consequence, there is a complete conductive connection between certain conductive tracks 102 and said components 106 of said component housings 110.

Figure 16:
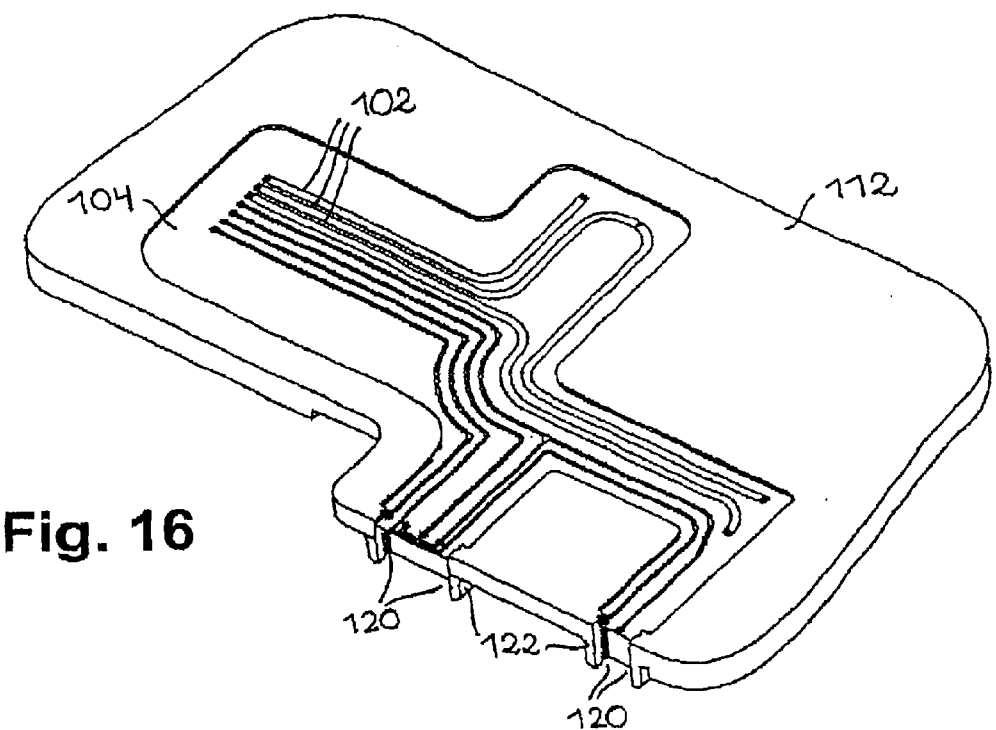
FIG. 16 shows a larger view of a foil carrier housing assembly after a step [3b] of a third method according to the invention is performed.
Figure 17:
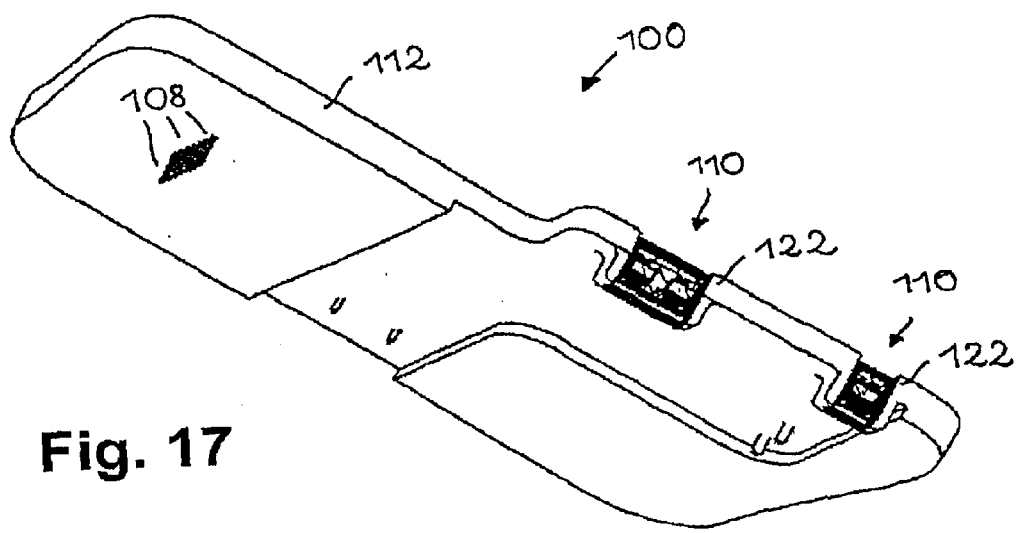
FIG. 17 shows a second view onto said foil carrier housing assembly according to FIG. 11 after a step [3c] of said third method is performed.

Finally, FIGS. 16, and 17, in combination with FIGS. 11, 12, and 13, show the manufacture of a component carrier housing assembly 100 according to a third method.

Manufacturing of the component housings 110 has been previously explained with reference to FIGS. 11–13.

FIG. 16 shows a foil 104 and a carrier housing 112 after a step of reverse side injection molding to the foil 104, i.e., the connection between the foil 104 and carrier housing 112 is effected such that the former adheres to the latter. In FIG. 16, no connecting protrusions 116 are provided at the carrier housing 112, and no connecting opening 118 are provided at the foil 104.

Finally, FIG. 17 shows the carrier housing after the electrical contact elements 108 and the component housings 110 have been mechanically and electrically connected to the carrier housing 112 and the foil 104.

Alternative arrangements for the individual components will be apparent to a skilled person. For example, instead of the grooves 120 and corresponding ridges 124 in the component housings, an arrangement of a snap fitting using retaining lugs could be provided. As such, it will be apparent to a skilled person that changes and modifications may be made without departing from the spirit and scope of the invention as set forth herein and shown in the accompanying drawings and as defined in the following claims.

We claim:

1. A carrier structure, comprising
   an open carrier housing having essentially planar shape and comprising at least one securing mechanism;
   at least one component housing having an essentially planar shape and comprising at least one securing mechanism; and a flexible foil having conductive tracks and embedded within said open carrier housing and said at least one component housing; and wherein securing mechanisms of said carrier housing and said at least one component housing being mutually engageable such that said at least one component housing is fixed at said open carrier housing in a spatial shape of approximately 90°; and whereing said carrier housing and said at least one component housing comprise a rigid edge which completely surrounds said flexible foil in said spatial shape.

2. The carrier structure of claim 1, wherein said at least one component housing, said open carrier housing and said flexible foil are separate parts and are connected together.

3. The carrier structure of claim 2, further comprising and a molding mass for sealing said at least one component housing, said molding mass having electrical components therein.

4. The carrier structure of claim 3, wherein said at least one component housing comprising connection portions and wherein said flexible foil comprising openings in one or more conductive tracks for receiving said connection portions, thereby providing conductive connection between one or more conductive tracks and said at least one component housing.

5. The carrier structure of claim 1, wherein said open carrier housing is formed of a carrier lattice having an enclosing frame with a plurality of transverse bridges therebetween.

6. The carrier structure of claim 5, wherein a portion of said rigid edge surrounds said at least one component housing; and further comprising a transition region connecting said portion to said enclosing frame.

7. The carrier structure of claim 6, wherein said transition region of said at least one component housing comprises a breakable bridge connecting said portion to said enclosing frame, said breakable bridge being broken away when said securing mechanisms are mutually engaged in said spatial shape.

8. The carrier structure of claim 1, wherein said open carrier structure comprising holding pins; and wherein said flexible foil comprising holding openings for receiving said holding pins.

9. The carrier structure of claim 1, wherein said component housing and said open carrier housing are injection molded structures.

* * * * *